(12) United States Patent
Sung et al.

(10) Patent No.: US 6,432,755 B2
(45) Date of Patent: Aug. 13, 2002

(54) THIN FILM TRANSISTOR AND MANUFACTURING METHOD THEREFOR

(75) Inventors: Chae Gee Sung; Jo Gyoo Chul, both of Miyagi-ken (JP)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/938,068

(22) Filed: Aug. 22, 2001

Related U.S. Application Data (62) Division of application No. 09/599,772, filed on Jun. 22, 2000, now Pat. No. 6,350,995.

(30) Foreign Application Priority Data

Jun. 23, 1999 (JP) .............................. 11-177537
Jan. 5, 2000 (JP) ........................ 2000-000521

(51) Int. Cl.[7] .............................................. H01L 21/84
(52) U.S. Cl. ........................................ 438/158; 438/687
(58) Field of Search ................................ 438/158–160, 438/907, 687

(56) References Cited

U.S. PATENT DOCUMENTS

| | | |
|---|---|---|
| 5,166,085 A | 11/1992 | Wakai et al. |
| 5,366,912 A | 11/1994 | Kobayashi et al. |
| 5,573,958 A | 11/1996 | Fukui et al. |
| 5,756,372 A | 5/1998 | Wakui et al. |
| 5,946,551 A | 8/1999 | Dimitrakopoulos et al. |
| 6,350,995 B1 * | 2/2002 | Sung et al. ................... 257/59 |

* cited by examiner

*Primary Examiner*—Richard Booth
(74) *Attorney, Agent, or Firm*—Brinks Hofer Gilson & Lione (57) ABSTRACT

A TFT structure having sufficiently low resistance wiring is provided, in which characteristic defects thereof caused by undercuts in a barrier metal layer can be prevented, the undercuts formed in a step for processing a source and a drain electrode composed of copper. The TFT structure of the present invention comprises a gate electrode on a glass substrate, a gate insulation film, a semiconductor active layer disposed on the gate insulation film so as to oppose the gate electrode, ohmic contact layers formed on both edge portions of the semiconductor active layer, and a source and a drain electrode connected to the semiconductor active layer via the respective ohmic contact layers. In addition, the source electrode and the drain electrode are formed of copper, and barrier metal layers are formed on the bottom surfaces of the source electrode and the drain electrode above areas at which the upper surfaces of the respective ohmic contact layers are located.

3 Claims, 8 Drawing Sheets

FIG. 8E

THIN FILM TRANSISTOR AND MANUFACTURING METHOD THEREFOR

This application is a divisional application of U.S. application Ser. No. 09/599,772 filed on Jun. 22, 2000, now U.S. Pat. No. 6,350,995 entitled Thin Film Transistor and Manufacturing Method Therefore.

BACKGROUND OF THE INVENTION

1. Field of the Invention

The present invention relates to thin film transistors (hereinafter referred to as TFTs) and to manufacturing methods therefor, and more particularly, to a TFT structure in which copper is used as a low resistance material specifically for source and drain wiring.

2. Description of the Related Art

Figure 4:
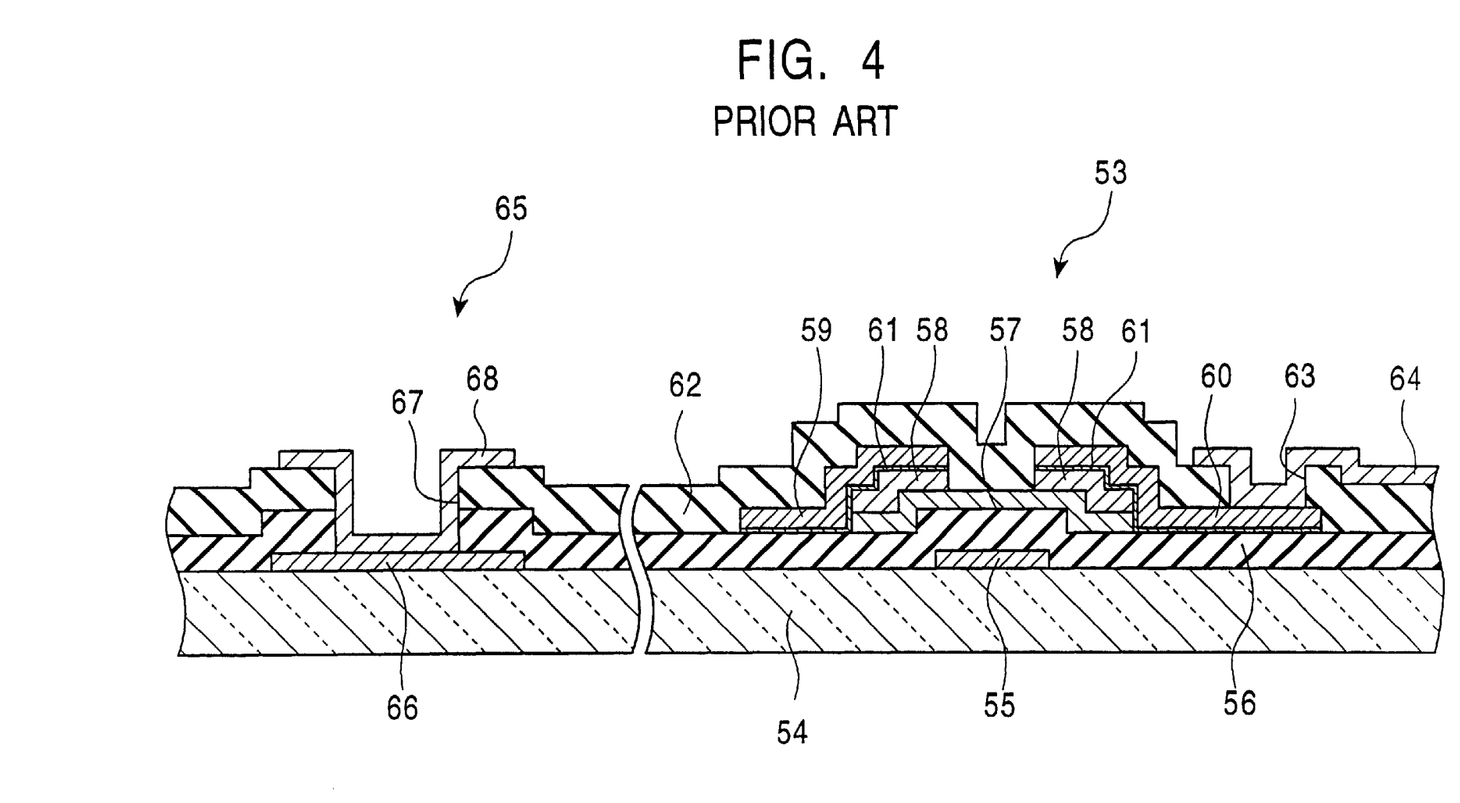
FIG. 4 is a cross-sectional view of the structure of a conventional TFT array substrate according to the prior art.
Figure 5A:
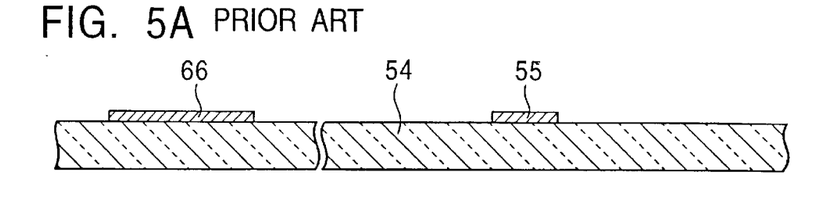
FIGS. 5A to 5E are cross-sectional views of the conventional TFT array substrate showing sequential steps of a manufacturing method according to the prior art.
Figure 5B:
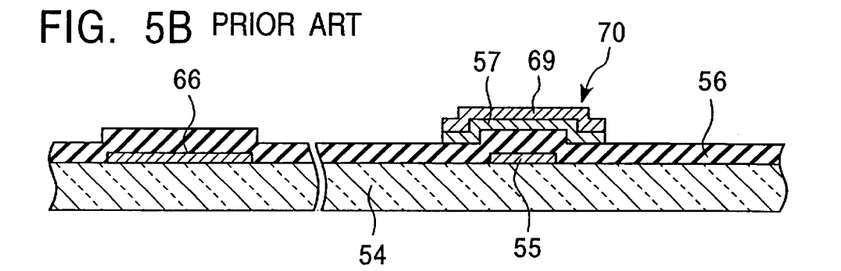
Figure 5C:
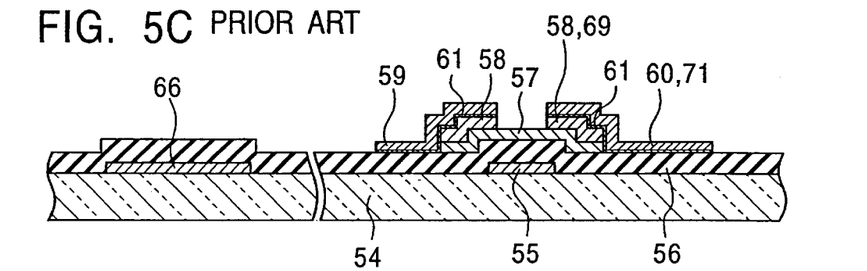
Figure 5D:
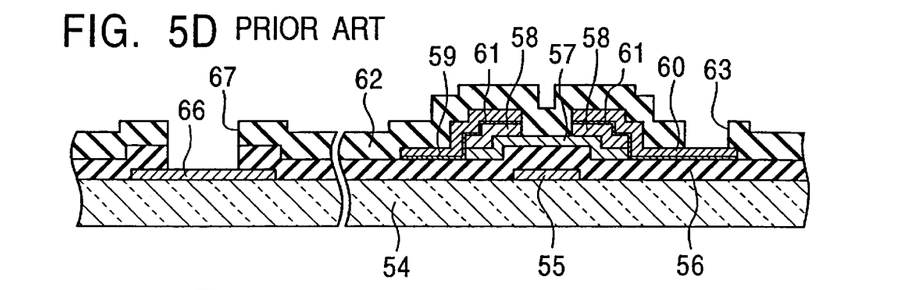
Figure 5E:
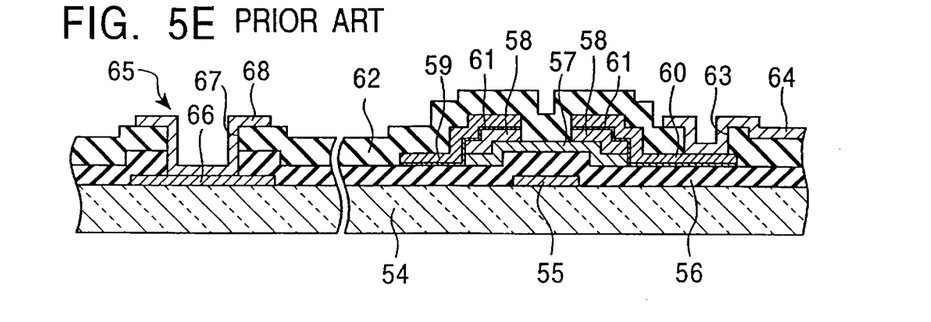
Figure 6:
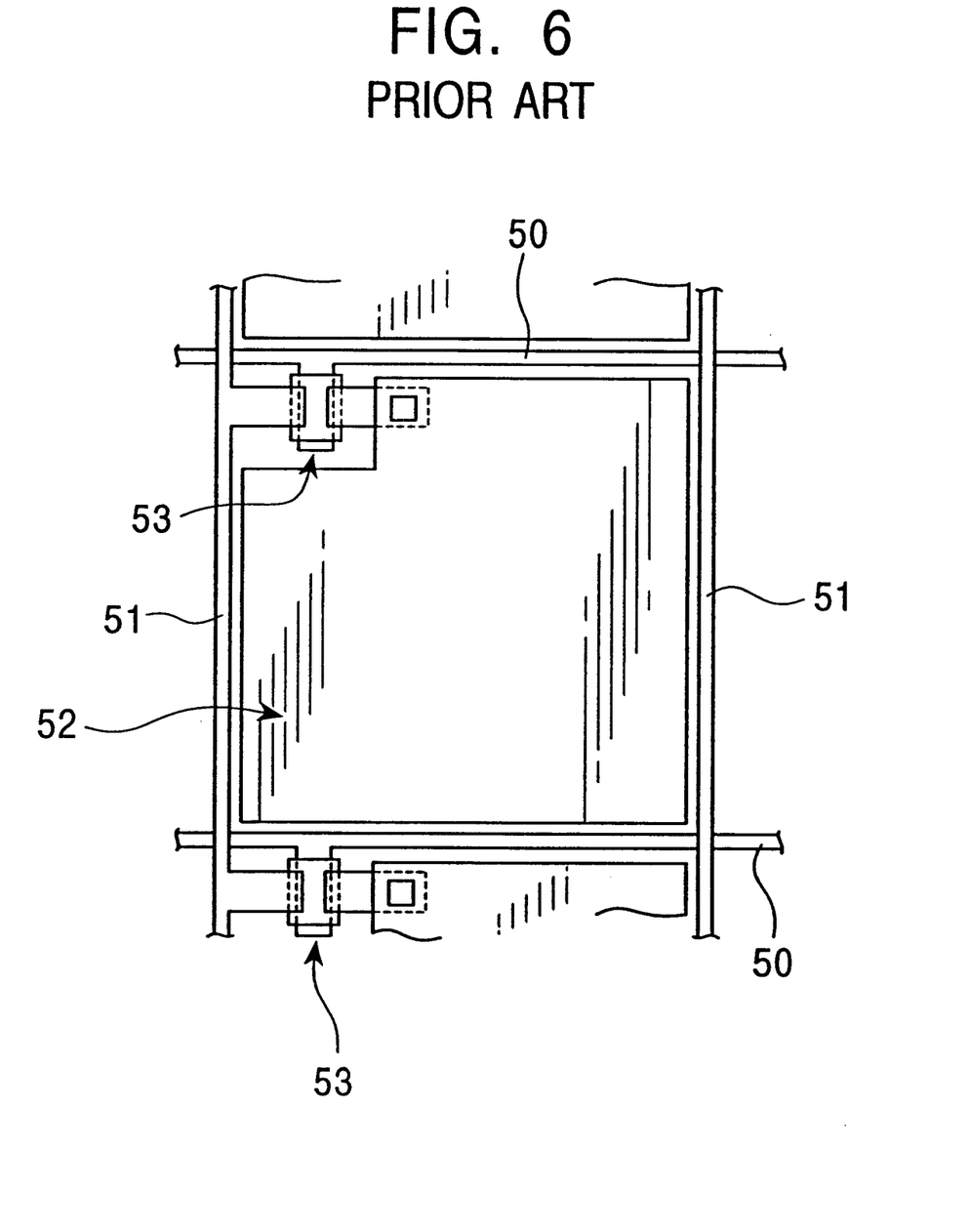
FIG. 6 is a plan view of the conventional TFT array substrate according to the prior art.

In conventional common TFT liquid crystal display devices, a TFT array substrate having a reverse-stagger type TFT, gate wiring, source wiring, and the like is provided, as shown in FIG. 6 as a structural example. In the TFT array substrate, as shown in FIG. 6, gate wiring 50 and source wiring 51 are disposed in the form of a matrix on a transparent substrate composed of glass or the like. An area surrounded by the gate wiring 50 and the source wiring 51 is a pixel 52, and a TFT 53 is formed in each pixel 52. Recently, copper, which is a low resistance material, has attracted attention as a wiring material for use in this kind of liquid crystal display device, semiconductor device, and the like. Accordingly, one example will be described below in which copper is applied to a TFT array substrate. FIG. 4 is a cross-sectional view of the TFT array substrate, and FIGS. 5A to 5E are cross-sectional views of the TFT showing a manufacturing process therefor.

In the TFT 53 as shown in FIG. 4, a gate electrode 55 extending from the gate wiring 50 is formed on a transparent substrate 54, and a gate insulation film 56 is formed so as to cover the gate electrode 55. A semiconductor active layer 57 composed of amorphous silicon (a-Si) is formed on the gate insulation film 56 above the gate electrode 55. A source electrode 59 extending from the source wiring 51 and a drain electrode 60 are formed above ohmic contact layers 58 formed on the semiconductor active layer 57 above the gate insulation film 56, in which the ohmic contact layers 58 are composed of amorphous silicon (a-Si:n$^+$) containing an n-type impurity such as phosphorus. The source wiring 51, source electrode 59, and the drain electrode 60 are formed of copper.

When the source electrode 59 and the drain electrode 60 are formed of copper, and when silicon forming the semiconductor active layer 57 and copper are placed directly in contact with each other, a problem arises with regard to copper film separation due to poor cohesion between silicon and copper, or degradation of TFT characteristics due to copper diffusion into silicon. Consequently, metal layers composed of, for example, titanium or molybdenum, are formed under the copper as barrier metal layers 61 so that the source wiring 51, the source electrode 59, and the drain electrode 60 have a two-layer structure composed of a barrier metal and copper.

Then, a passivation film 62 is formed so as to cover the TFT 53 composed of the source electrode 59, the drain electrode 60, the gate electrode 55, and the like. A contact hole 63 is formed in the passivation film 62 above the drain electrode 60. A pixel electrode 64 is further formed, which is composed of a transparent conductive film, such as an indium-tin-oxide compound (hereinafter referred to as ITO), and is electrically connected to the drain electrode 60 via the contact hole 63.

A left side of the discontinuity in FIG. 4 shows a cross-sectional structure of a gate terminal pad portion 65 which is an end portion of the gate wiring located outside the display area. As shown in this figure, a contact hole 67 penetrating the gate insulation film 56 and the passivation film 62 is formed above a lower pad layer 66 composed of a gate wiring material on the transparent substrate 54, and an upper pad layer 68 is formed of the same transparent conductive film as that used for the pixel electrode 64 so as to be electrically connected with the lower pad layer 66 via the contact hole 67.

When the thin film transistor array substrate is manufactured, as shown in FIG. 5A, a conductive film is formed on the transparent substrate 54, and is then patterned, so that the gate electrode 55 and the gate wiring 50 are formed. In addition, the lower pad layer 66 is formed in the gate terminal pad portion 65.

Next, as shown in FIG. 5B, after forming the gate insulation film 56 so as to cover the gate electrode 55 and the gate wiring 50, an a-Si film (to later become semiconductor active layer 57), and an a-Si:n$^+$ film 69 are sequentially formed, and the a-Si film and the a-Si:n$^+$ film 69 thus formed are simultaneously patterned by using a photo mask, whereby an island 70 is formed above the gate electrode with the gate insulation film 56 provided therebetween.

As shown in FIG. 5C, after sequentially forming the barrier metal film 61 composed of, for example, titanium or molybdenum, and a copper film 71 over the entire surface of the substrate, the copper film 71 and the barrier metal film 61 are patterned so as to form the drain electrode 60, the source electrode 59, and the source wiring 51, and the a-Si:n$^+$ film above a channel region composed of the a-Si film is removed so as to form the ohmic contact layers 58 composed of the a-Si:n+film.

Next, as shown in FIG. 5D, the passivation film 62 is formed over the entire surface of the substrate, and is then patterned so as to form openings therein above the drain electrode 60 and the lower pad layer 66, whereby the contact holes 63 and 67 are formed for electrical connections between the drain electrode 60 and the pixel electrode 64 and between the lower pad layer 66 and the upper pad layer 68, respectively.

Finally, as shown in FIG. 5E, the ITO film is formed over the entire surface of the substrate, and is then patterned so as to form the pixel electrode 64 and the upper pad layer 68. By executing the steps described above, the conventional TFT array substrate shown in FIG. 4 is completed.

However, in the conventional TFT array substrate, there are problems as described below.

That is, since the source electrode and the drain electrode are laminates each composed of the barrier metal layer (titanium, molybdenum, or the like) and copper, a cell reaction occurs between the titanium, molybdenum, or the like and the copper when the laminate is etched, and as a result, undercuts in the barrier metal layer are formed at the side surfaces of the pattern. When the undercuts are formed at the above-mentioned location, there are problems with regard to an increase in off-current of the TFT and worsening of residual images. In addition, the wiring widths are difficult to control due to the occurrence of the undercuts in the barrier metal layer, and as a result, there is a problem in that desired characteristics of the TFT cannot be obtained. Furthermore, even though the copper, which is a low resistance material, is used, the barrier metal layer having a higher resistance than that of copper is used as an under layer, and hence, the advantages of copper which has a lower resistance are not sufficiently exploited.

SUMMARY OF THE INVENTION

In order to solve the problems described above, an object of the present invention is to provide a TFT structure and a manufacturing method therefor, in which characteristic defects in the TFT can be prevented, which were caused by undercuts in a barrier metal layer formed in a step for processing a source electrode and a drain electrode composed of copper, and a low resistance wiring can thereby be adequately realized.

To these ends, the TFT of the present invention comprises a gate electrode formed on a substrate, a gate insulation film formed so as to cover the gate electrode, a semiconductor active layer formed on the gate insulation film so as to oppose the gate electrode, ohmic contact layers formed of a doped semiconductor layer and separately formed on two edge portions of the semiconductor active layer, and a source electrode and a drain electrode connected to the semiconductor active layer via the respective ohmic contact layers, wherein the source electrode and the drain electrode are composed of copper, and barrier metal layers are formed on the bottom surfaces of the source electrode and the drain electrode above areas at which the upper surfaces of the respective ohmic contact layers are located.

In conventional TFT structures, when copper is used as a material for a source and a drain electrode, a barrier metal layer is formed on the entire bottom surface of the copper layer, and the overall electrode (wiring) is generally a two-layer structure. In contrast, in the TFT structure of the present invention, the barrier metal layers are formed on the bottom surfaces of the source electrode and the drain electrode above areas at which the upper surfaces of the ohmic contact layers are located, and the barrier metal layers are not formed on other areas at which the upper surfaces of the gate insulation film are located.

In order to practically form the structure described above, since the barrier metal layer and the copper layer cannot be formed by simultaneous patterning, the copper film is formed after forming the barrier metal layer by patterning. Consequently, unlike in conventional methods in which a laminate composed of a barrier metal layer and a copper layer is formed by simultaneous etching, undercuts in the barrier metal layer are not formed, which is caused by a cell reaction during etching. As a result, characteristic defects of the TFT caused by the undercuts formed in the barrier metal layer can be prevented. In addition, since the barrier metal layers are only present above areas at which the ohmic contact layers are formed, and the source wiring portion is only formed of, for example, copper, resistance of the wiring can be lowered compared to that of the conventional wiring.

As a material used for the barrier metal layer, a metal selected from the group consisting of titanium, molybdenum, tantalum, chromium, and tungsten, or an alloy thereof may be used.

A method for manufacturing a thin film transistor comprises steps of forming an electrically conductive film on a substrate, patterning the electrically conductive film to form a gate electrode, forming a gate insulation film so as to cover the gate electrode, a semiconductor film, a doped semiconductor film doped with an impurity, and a barrier metal film in that order, patterning the barrier metal film, the doped semiconductor film, and the semiconductor film so as to form a laminated island having a semiconductor active layer formed of the semiconductor film, the doped semiconductor film, and the barrier metal film, forming a copper film so as to cover the laminated island and the gate insulation film, patterning the copper film so as to form a source electrode and a drain electrode extending from the laminated island onto the gate insulation film, and removing the barrier metal film and the doped semiconductor film by etching using the source electrode and the drain electrode as a mask so that ohmic contact layers formed of the doped semiconductor film and patterned layers formed of the barrier metal film are present above the two edge portions of the semiconductor active layer.

According to the method for manufacturing the TFT described above, the TFT structure of the present invention can be formed. In the TFT structure of the present invention, as described above, patterning of the barrier metal film and the patterning of the copper film are separately performed. However, after sequentially forming the four films, i.e., the gate insulation film, the semiconductor film, the doped semiconductor film, and the barrier metal film, a laminated island having the semiconductor active layer, the doped semiconductor film, and the barrier metal film is formed by patterning the barrier metal film, the doped semiconductor film, and the semiconductor film. That is, in the manufacturing method of the present invention, since the barrier metal film is simultaneously patterned with the semiconductor active layer and the doped semiconductor film in a step for forming the laminated island, only barrier metal film is not separately patterned. Accordingly, compared to the conventional manufacturing process, the number of photomasks to be used is not increased.

In the manufacturing method described above, the gate insulation film, the semiconductor film, the doped semiconductor film, and the barrier metal film are preferably sequentially formed without being exposed in the air. When the four-layer formation mentioned above is performed, oxide layers are not formed between four layers, and as a result, the characteristics of the TFT are not adversely affected. In addition, steps for removing oxide layers can be omitted, and hence, the number of manufacturing steps can be reduced.

Film formation described above can be realized by using, for example, chemical vapor deposition (CVD). For example, a gate insulation film composed of a silicon oxide film or a silicon nitride film, a semiconductor film and a doped semiconductor film composed of amorphous silicon or polycrystalline silicon, and a barrier metal film composed of various metals can be formed by changing ingredient gases using one CVD apparatus. When the barrier metal film, in particular, is formed using metal organic chemical vapor deposition (hereinafter referred to as MOCVD), all four layers can be formed by CVD.

In another thin film transistor in accordance with the basic structure of the thin film transistor according to the present invention, the barrier metal layer may comprise titanium, and titanium oxide layers may be formed between the source electrode and the barrier metal layer and between the drain electrode and the barrier metal layer.

Another method for manufacturing a thin film transistor according to the present invention comprises steps of forming an electrically conductive film on a substrate, patterning the electrically conductive film so as to form a gate electrode, forming a gate insulation film so as to cover the gate electrode, a semiconductor film, a doped semiconductor film doped with an impurity, and a barrier metal film comprising titanium in that order, patterning the barrier metal film, the doped semiconductor film, and the semiconductor film so as to form a laminated island having a semiconductor active layer formed of the semiconductor film, the doped semiconductor film, and the barrier metal film, forming a copper film so as to cover the laminated island and the gate insulation film, patterning the copper film and the barrier metal film by using the same etchant so as to form a source electrode and a drain electrode extending from the laminated island onto the gate insulation film, and removing the doped semiconductor film by etching using the source electrode and the drain electrode as a mask so that ohmic contact layers formed of the doped semiconductor film and patterned layers formed of the barrier metal film are present above the two edge portions of the semiconductor active layer.

In the basic structure of the thin film transistor according to the present invention, when titanium is used, particularly for the barrier metal layer, portions of the source electrode and the drain electrode located above the semiconductor active layer are a two-layer structure composed of titanium and copper. The inventors of the present invention found etchants capable of simultaneously etching a laminate composed of titanium and copper. They are, specifically, an aqueous solution containing monohydrogen potassium peroxomonosulfate and hydrogen fluoride; an aqueous solution containing a peroxosulfate salt, hydrogen fluoride, and hydrogen chloride or a chloride compound; and an aqueous solution containing a peroxosulfate salt and a fluoride. Accordingly, even though patterning separately performed for the barrier metal film and the copper film is described heretofore, instead of the manufacturing method described above, patterning of the barrier metal film and patterning of the source electrode and the drain electrode can be simultaneously performed by applying the etchants to the present invention. The patterning of the barrier metal film in this case is specifically to remove the barrier metal film formed above a channel region of the TFT in the laminated island.

However, when the laminated film composed of titanium and copper is etched using the etchant described above, etching residue may remain on the ohmic contact layer and the gate insulation film in some cases, resulting in variations in the TFT characteristics or degradation of reliability. In this case, when a laminated structure is formed so as to have a titanium oxide layer between the titanium and the copper, uniformity obtained in the simultaneous etching is improved, and hence, the problems described above are unlikely to occur.

In the basic structure of the thin film transistor according to the present invention, the semiconductor active layer is preferably in direct contact with the source electrode and the drain electrode at two edge surfaces of the semiconductor active layer, and the two edge surfaces of the semiconductor active layer are preferably formed at positions outside areas defined by projecting the gate electrode to the gate insulation film.

In the thin film transistor of the present invention, since the barrier metal layers are only present above the areas at which the upper surfaces of the ohmic contact layers are located, the semiconductor active layer are in direct contact with the source electrode and the drain electrode at the two edge surfaces of the semiconductor active layer. In this case, when contacting points therebetween are close to the gate electrode, the electric fields from the gate electrode adversely affect the contacting points, resulting in a problem with regard to an increase in off-current of the TFT. Consequently, the contacting points are formed so as to be distant from the positions defined by projecting the gate electrode to the gate insulation film, i.e., the contacting points are preferably formed distant from the ends of the gate electrode so as not to be adversely affected by the electric fields from the gate electrode. Accordingly, the problems with regard to an increase in off-current can be avoided.

DESCRIPTION OF THE PREFERRED EMBODIMENTS

First Embodiment

Hereinafter, a first embodiment of the present invention will be described with reference to FIGS. 1 to 3.

In a TFT and a manufacturing method therefor of the first embodiment, copper is used for a source electrode and a drain electrode in a reverse-stagger TFT, and a manufacturing process is a process using five masks.

Figure 1:
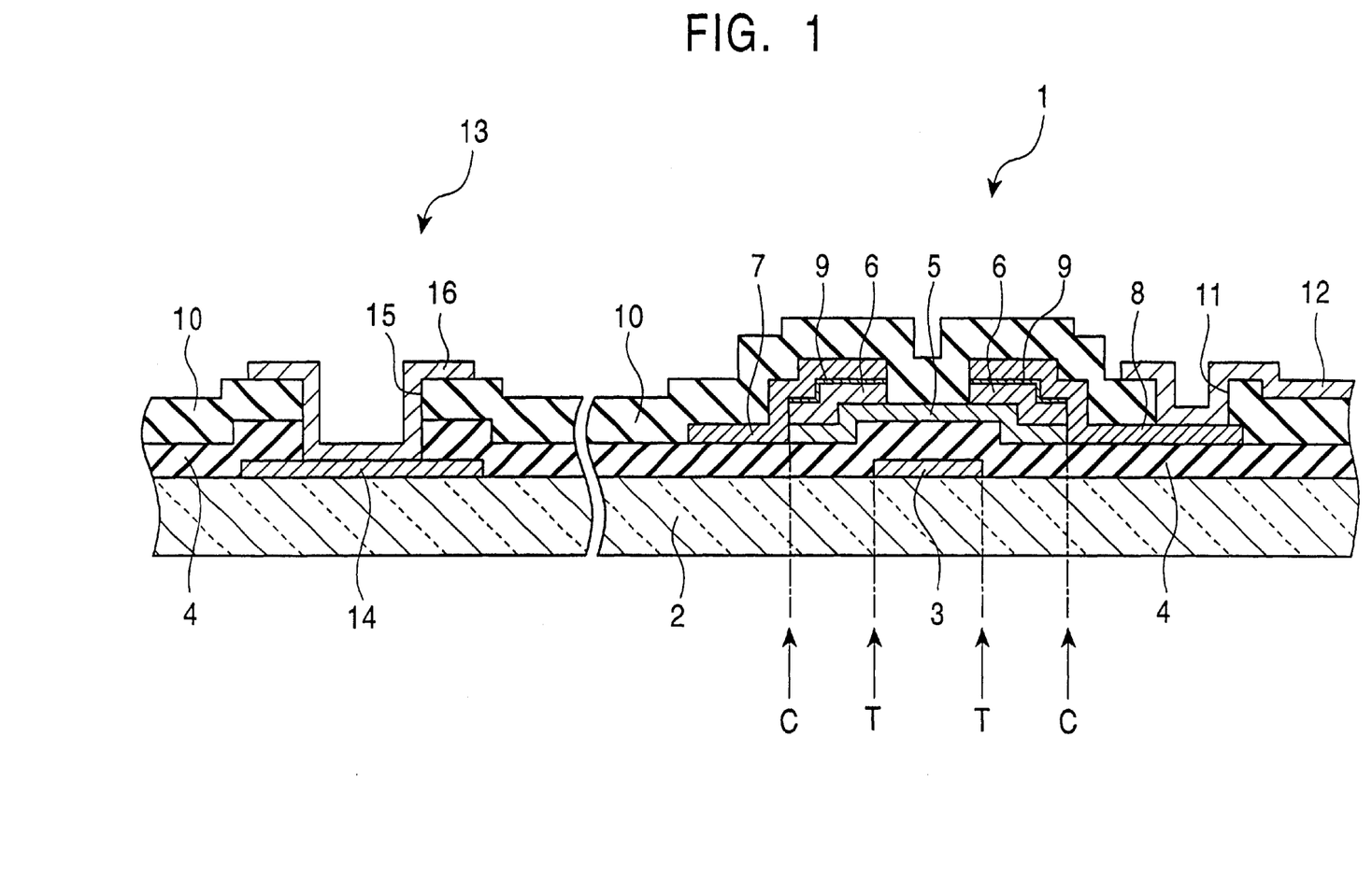
FIG. 1 is a cross-sectional view of the structure of a TFT array substrate according to a first embodiment of the present invention.

FIG. 1 is a cross-sectional view of a TFT array substrate which is one of substrates opposing each other separated by a liquid crystal layer provided therebetween in a liquid crystal display device. FIGS. 2A to 2E are cross-sectional views of the TFT array substrate showing sequential steps of the manufacturing method for the first embodiment.

In a TFT 1, as shown in FIG. 1, a gate electrode 3 extending from a gate wiring is formed on a glass substrate 2. A gate insulation film 4 composed of $SiO_x$ or $SiN_x$ is formed so as to cover the gate electrode 3. In this embodiment, aluminum is used as a gate wiring (electrode) material. A semiconductor active layer 5 composed of amorphous silicon (a-Si) is formed on the gate insulation layer 4 above the gate electrode 3. A source electrode 7 extending from a source wiring and a drain electrode 8 are formed above the semiconductor active layer 5 with ohmic contact layers 6 provided therebetween. The ohmic contact layers 6 are composed of amorphous silicon (a-Si:n+) containing an n-type impurity such as phosphorus.

The source wiring, the source electrode 7, and the drain electrode 8 are formed of copper. The barrier metal layers 9 are formed only on the bottom surfaces of the source electrode 7 and the drain electrode 8 above areas at which the upper surfaces of the ohmic contact layers are located. As a material used for the barrier metal layer 9, a metal selected from the group consisting of titanium, molybdenum, tantalum, chromium, and tungsten, or an alloy thereof is used.

A passivation film 10 composed of $SiO_x$ or $SiN_x$ is formed so as to cover the TFT 1 composed of the source electrode 7, the drain electrode 8, the gate electrode 3, and the like. A contact hole 11 is formed above the drain electrode 8 in the passivation film 10. In addition, a pixel electrode 12 composed of ITO is formed which is electrically connected to the drain electrode 8 via the contact hole 11.

At two edge surfaces of the semiconductor active layer 5, the semiconductor active layer 5 is in direct contact with the source electrode 7 and the drain electrode 8. When the TFT is observed from above in the figure, it is understood that a large island structure is formed, i.e., contacting points C of the semiconductor active layer 5 with the source electrode 7 and the drain electrode 8 are positioned distant from the edges T of the gate electrode 3. The distance between the contacting point C and the edge T of the gate electrode 3 is at least, for example, approximately 2 μm. Since the distance mentioned above is restricted by alignment accuracy in a photolithographic process, the distance is determined so that an electric field from the edge T of the gate electrode 3 does not adversely affect the contacting point C, even when there is maximum misalignment.

The left side of the discontinuity in FIG. 1 shows a cross-sectional structure of a gate terminal pad portion 13 which is an end portion of the gate wiring located outside the display area. As shown in this figure, a contact hole 15 penetrating the gate insulation film 4. The passivation film 10 is formed above a lower pad layer 14 composed of a gate wiring material formed on a glass substrate 2. An upper pad layer 16 composed of the ITO film, is formed so as to be electrically connected with the lower pad layer 14 via the contact hole 15.

When the TFT array substrate described above is manufactured, as shown in FIG. 2A, an aluminum film (conductive film) is formed on the glass substrate 2, and is then patterned by a common photolithographic method so as to form the gate electrode 3 and the gate wiring. In addition, the lower pad layer 14 is formed in the gate terminal pad portion 13.

Figure 2A:
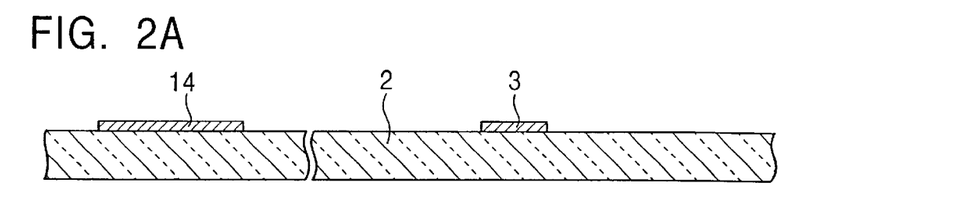
FIGS. 2A to 2E are cross-sectional views of the TFT array substrate according to the first embodiment showing sequential steps of a manufacturing method therefor.
Figure 2B:
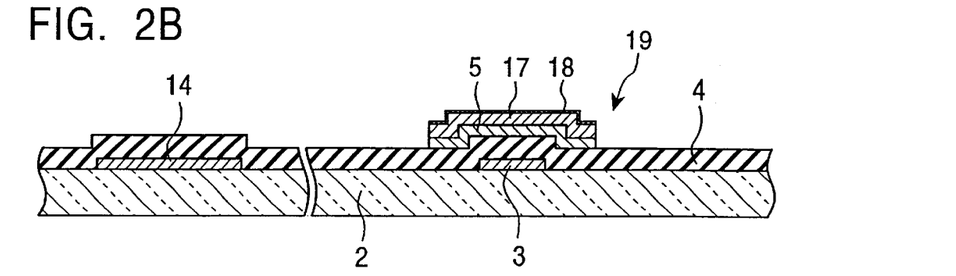

Next, as shown in FIG. 2B, four layers, i.e., a $Sio_x$ or a $SiN_x$ film (gate insulation film 4), an a-Si film (to later become semiconductor active layer 5), an a-Si:n$^+$ film 17 (doped semiconductor film), and a barrier metal film 18, are sequentially formed over the entire surface of the substrate. In this case mentioned above, a sequential film formation can be performed in the same vacuum by using a chemical vapor deposition apparatus (CVD) without exposing the substrate in the air. In order to perform the sequential film formation mentioned above, gases to be fed into the CVD apparatus are selected in accordance with the film to be formed. Conventionally common gases are used for forming a $SiO_x$ film, a $SiN_x$ film, an a-Si film, and an a-Si:n$^+$ film. Concerning the barrier metal film, when formed by metal-organic CVD (MOCVD), for example, molybdenum hexacarbonyl ($Mo(CO)_6$) is used for a molybdenum film, chromium hexacarbonyl ($Cr(CO)_6$) is used for a chromium film, and tungsten hexacarbonyl ($W(CO)_6$) is used for a tungsten film.

After forming four layers, a photoresist (not shown) is coated on the barrier metal film, and is then exposed using a photo mask and is developed so as to form a resist pattern.

Next, by using the resist pattern thus formed as a mask, 3 layers out of 4 layers described above, i.e., the barrier metal film 18, the a-Si:n$^+$ film 17, and the a-Si film are etched. As has thus been described, an island 19 is formed, which is a laminate composed of the semiconductor active layer 5, the a-Si:n$^+$ film 17, and the barrier metal film 18.

In an etching step for these films, wet etching and dry etching are both used. In the case in which wet-etching is performed, the following solutions can be used for the individual films: a mixture of hydrogen fluoride (HF) and ammonium fluoride ($NH_4F$) or a mixture of HF and water ($H_2O$) for the $SiO_x$ film, a mixture of HF and $NH_4F$ or hot phosphoric acid ($H_3PO_4$) for the $SiN_x$ film, a mixture of HF and nitric acid ($HNO_3$) (acetic acid ($CH_3COOH$) may be included) for the a-Si film and the a-Si:n$^+$ film, a mixture of HF and $HNO_3$ for the titanium film, a mixture of HF and $HNO_3$ ($CH_3COOH$ may be included) for the molybdenum film, a mixture of HF and $HNO_3$ for the tantalum film, a mixture of $(NH_4)Ce(NO_3)_6$ and $HNO_3$ or a mixture of $(NH_4)Ce(NO_3)_6$, $HClO_4$, and $H_2O$ for the chromium film, and a mixture of HF and $HNO_3$ for the tungsten film. In the case in which dry etching is performed, the following gases can be used for the individual films: an HF gas, a $CF_4$ gas ($O_2$ may be included), or a mixture of $CHF_3$ and )$_2$ for the $Sio_x$ film, a $CF_4$ gas ($O_2$ may be included), a mixture of $CHF_3$ and $O_2$, or a $SF_6$ gas for the $SiN_x$ film, a mixture of $CF_4$ and $O_2$, a mixture of $CCl_4$ and $O_2$, or a $SF_6$ gas for the a-Si film and the a-Si:n$^+$ film, a mixture of $CF_4$ and $O_2$ for the titanium film, a $CF_4$ gas ($O_2$ may be included) for the molybdenum film, a mixture of $CF_4$ and $O_2$ for the tantalum film, a $CCl_4$ gas ($O_2$ may be included) for the chromium film, and a $CF_4$ gas ($O_2$ may be included) for the tungsten film.

Figure 2C:
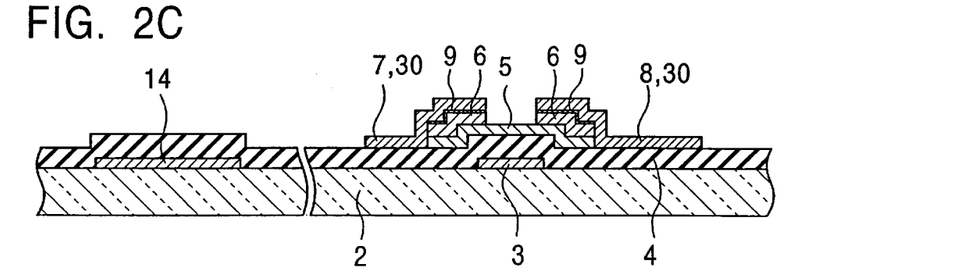

Next, as shown in FIG. 2C, a copper film 30 is formed over the entire surface of the substrate and is then patterned by a photolithographic method so as to form the source wiring, the source electrode 7, and the drain electrode 8. In this step, an aqueous solution composed of 9% of $(NH_4)_2S_2O_2$ and 0.5% of $NH_4Cl$ is used as an etchant for copper. Subsequently, among the 3 layers composing the island 19, the barrier metal film 18 and the a-Si:n$^+$ film 17, which are above a channel region, are etched out. Accordingly, the ohmic contact layers 6 are formed on a source region and a drain region, which are at the two edges of the semiconductor active layer 5, whereby the barrier metal layers 9 only remain on the upper surfaces of the individual ohmic contact layers 6.

Figure 2D:
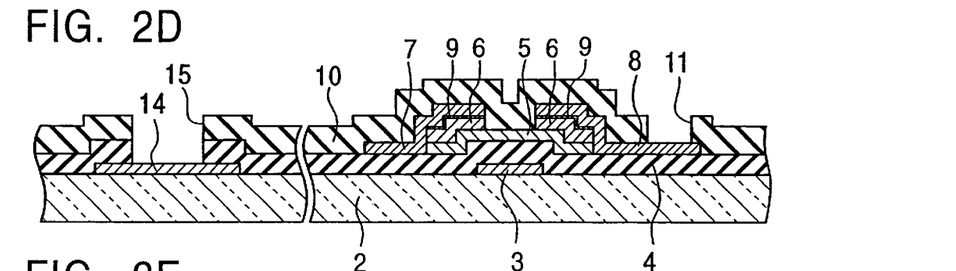

Next, as shown in FIG. 2D, $SiO_x$ or $SiN_x$ are formed over the entire surface of the substrate so as to form the passivation film 10. Then, by patterning the passivation film 10 by a photolithographic method, an opening in the passivation film 10 above the drain electrode 8 and an opening in the passivation film 10 and the gate insulation film 4 above the lower pad layer 14 in the gate terminal pad portion 13 are formed, whereby a contact hole 11 to electrically interconnect the drain electrode 8 and the pixel electrode 12, and a contact hole 15 to electrically interconnect the lower pad 14 and the upper pad 15, are formed.

Figure 2E:
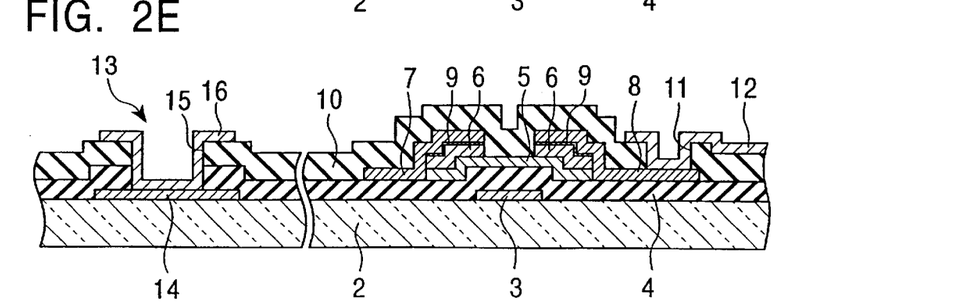

As shown in FIG. 2E, an ITO film is formed over the entire surface of the substrate and is then patterned by a photolithographic method so as to form the pixel electrode 12 and the upper pad layer 16 in the gate terminal pad portion 13. By executing the steps thus described, the TFT array substrate can be manufactured. Then, the TFT array substrate and an opposing substrate provided with common electrodes are prepared, and liquid crystal is encapsulated between the two substrates, thereby manufacturing a liquid crystal display device.

In the method for manufacturing the TFT of the first embodiment, the barrier metal layers 9 are patterned in a step for forming the island prior to a step for forming the source and the drain electrode. The copper film 30 is then formed and etched. This method differs from the conventional method in which a laminate composed of a barrier metal layer and copper is formed by simultaneous etching in a step for forming a source electrode and a drain electrode. That is, since etching steps for the barrier metal film and for the copper film are separately performed in the present invention, undercuts in the barrier metal layer caused by a cell reaction during etching are not formed. Consequently, characteristic defects of the TFT caused by the undercuts in the barrier metal layer can be reliably prevented. In addition, since the barrier metal layers are only present above the areas at which the ohmic contact layers 6 are formed, and the source wiring is only formed of copper, resistance of the source wiring can be lowered compared to that of the conventional wiring.

Furthermore, according to the method for manufacturing the TFT, as described above, even though patterning of the barrier metal and patterning of the copper are performed separately, the patterning of the barrier metal film 18 is performed in a step for forming the island, i.e., the patterning is not only performed for the barrier metal film. Accordingly, similar to the conventional manufacturing process, the process of the embodiment is performed by using five masks. The number of the masks to be used is not increased. In addition, since four layers are sequentially formed, oxide layers between the four layers are not formed, whereby characteristics of the TFT are not degraded. Furthermore, steps for removing oxide layers can be omitted, and as a result, a reduction in the number of manufacturing steps can be achieved.

In addition, the contacting points of the semiconductor active layer 5 with the source electrode 7 and the drain electrode 8 are positioned, for example, at approximately 2 $\mu$m distant from the edges T of the gate electrode. Consequently, electric fields from the edges T of the gate electrode, which are generated when the TFT is driven, do not adversely affect the contacting points. Hence, off-current of the TFT can be controlled.

In this connection, the inventors of the present invention investigated the dependence of resistance of the copper wiring having the barrier metal layer thereunder on an annealing condition in the manufacturing process. Basic annealing conditions were set to be an $N_2$ gas atmosphere for 2 hours. The films used for the study were a 1,500 Å-thick copper film provided with a 500 Å-thick barrier metal film thereunder. Under these conditions, annealing temperatures and barrier metals were variously changed. After annealing was performed, sheet resistances of the wirings were measured. The results are shown in FIG. 3. In FIG. 3, the horizontal axis indicates an annealing temperature (° C.) and the vertical axis indicates sheet resistance ($\Omega$/sq.). The following symbols indicate wiring structures: ○ for titanium (Ti, barrier metal)/copper (Cu), □ for titanium nitride (TiN, barrier metal)/Cu, △ for molybdenum (Mo, barrier metal)/Cu, ▽ for chromium (Cr, barrier metal)/Cu, and X for TiN/Ti (two-layer barrier metal)/Cu.

Figure 3:
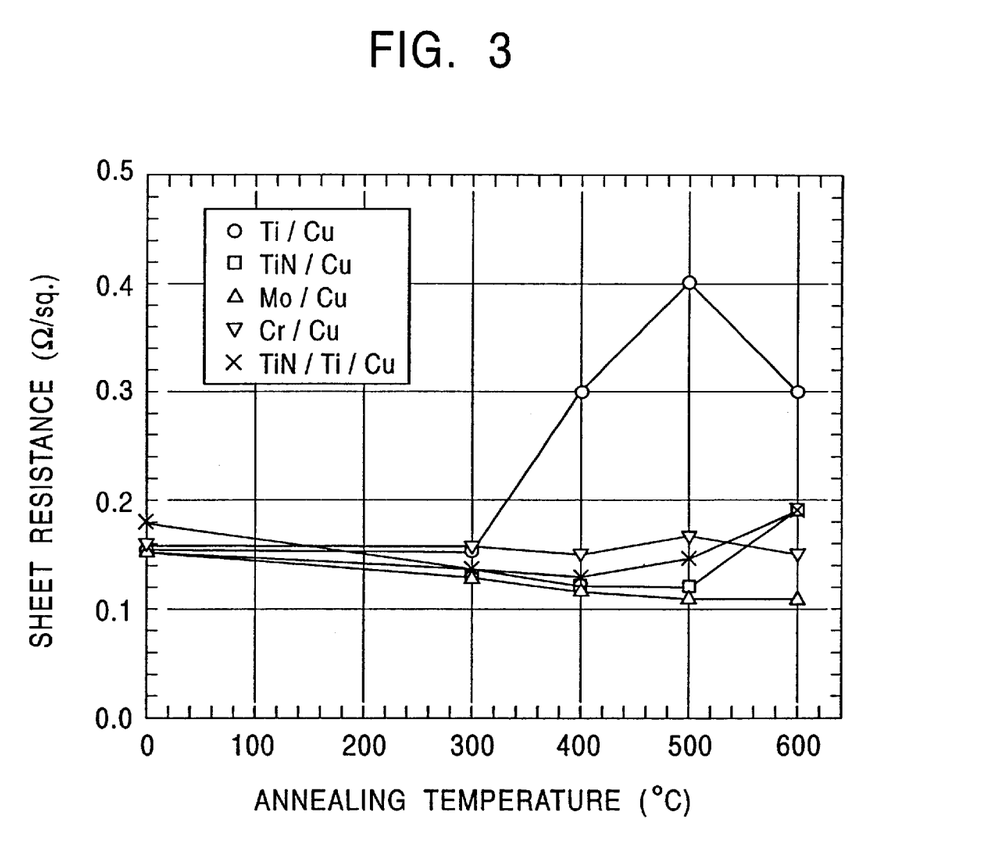
FIG. 3 is a graph showing the relationship between an annealing temperature and a sheet resistance of a copper wiring provided with a barrier metal layer thereunder.

As shown in FIG. 3, the sheet resistances of many wiring structures were not significantly changed, i.e., 0.1 to 0.2 $\Omega$/sq., after annealing thereof up to 600° C. However, only when the barrier metal was Ti, the sheet resistance thereof tended to rapidly increase when the annealing temperature exceeded 300° C. Accordingly, when there is an annealing step at more than 300° C., and in particular, when Ti is used as a barrier metal, there is a shortcoming with regard to an increase in wiring resistance. However, according to the TFT structure of the present invention, the barrier metal layers are only present above the areas at which the ohmic contact layers of the TFT are formed and are not present in the wiring portion. As a result, even if there is an annealing step at a higher temperature, it is expected that the shortcoming mentioned above will not occur, and lower resistance wiring can be obtained.

Second Embodiment

Hereinafter, the second embodiment will be described with reference to FIGS. 7 and 8.

Figure 7:
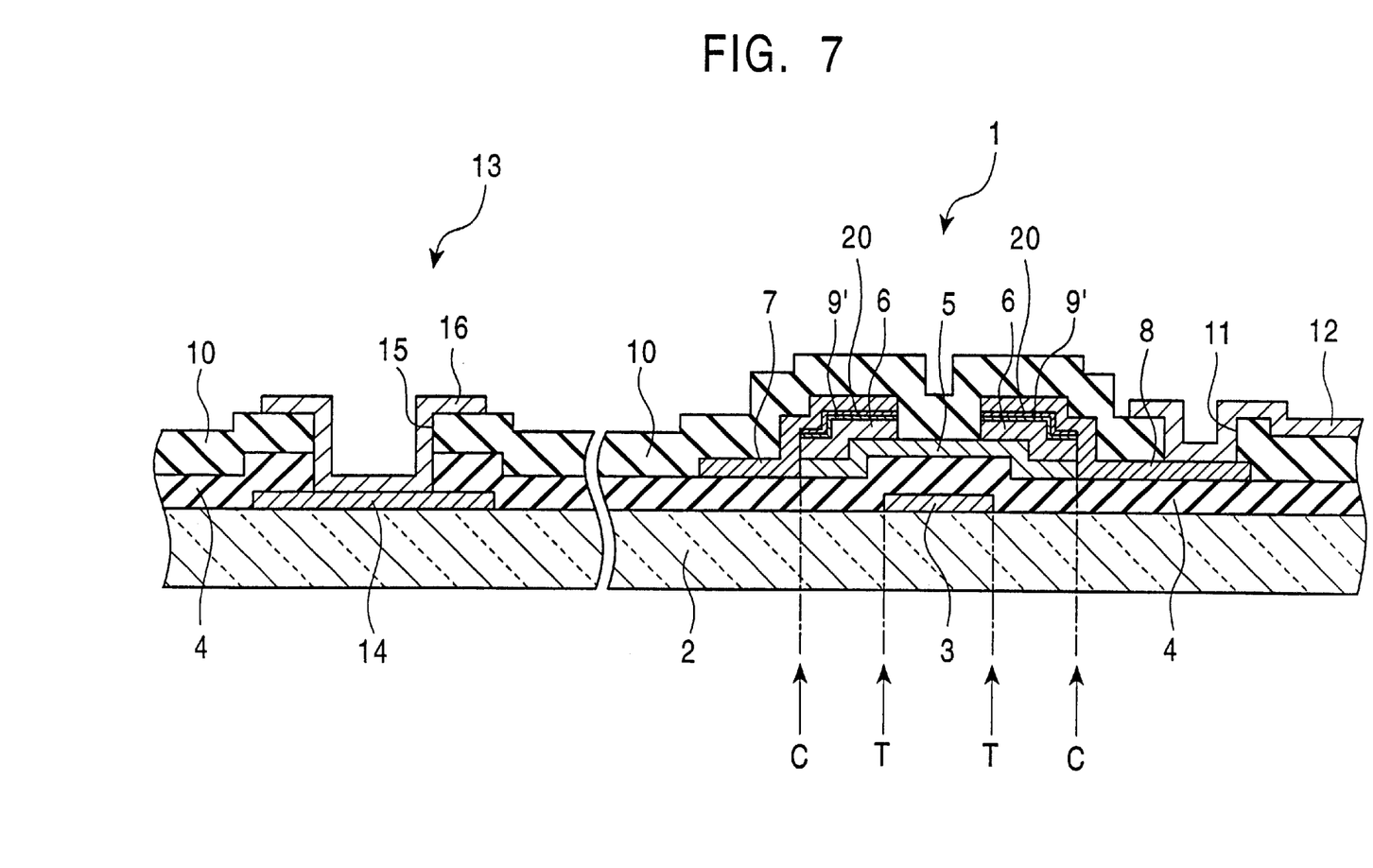
FIG. 7 is a cross-sectional view of the structure of a TFT array substrate according to a second embodiment of the present invention.

FIG. 7 is a cross-sectional view of a TFT array substrate that is one of the opposing substrates with a liquid crystal layer provided therebetween. The TFT structure according to the second embodiment is equivalent to that of the first embodiment except that other layers are disposed between a barrier metal layer and a source electrode and between the barrier metal layer and a drain electrode. Accordingly, the same references of the constituent elements shown in FIG. 1 designate the same elements in FIG. 7, and descriptions thereof will be omitted.

FIGS. 8A to 8E are cross-sectional views of the TFT array substrate showing sequential steps of the manufacturing method for the second embodiment.

In the TFT according to the first embodiment, the barrier metal layers 9 formed only above the ohmic contact layers 6 on the semiconductor active layer 5 are in direct contact with the source electrode 7 and the drain electrode 8. In contrast, in the TFT array substrate of the second embodiment, as shown in FIG. 7, a material for barrier metal layers 9' is titanium. The barrier metal layer 9' composed of titanium and a titanium oxide layer 20 are sequentially formed on each ohmic contact layer 6. Furthermore, the source electrode 7 and the drain electrode 8 are formed thereon. Accordingly, a laminated structure composed of titanium, titanium oxide, and copper is formed on each ohmic contact layer 6.

Next, a method for manufacturing the TFT array substrate of the second embodiment will be described.

Figure 8A:
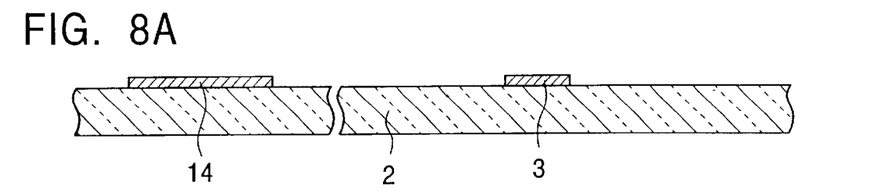
FIGS. 8A to 8E are cross-sectional views of the TFT array substrate according to the second embodiment showing sequential steps of a manufacturing method therefor.

As shown in FIG. 8A, an aluminum film (electrically conductive film) is formed on a glass substrate 2, and is then patterned by a common photolithographic method so as to form a gate electrode 3 and a gate wiring. This step is equivalent to that in the first embodiment.

Figure 8B:
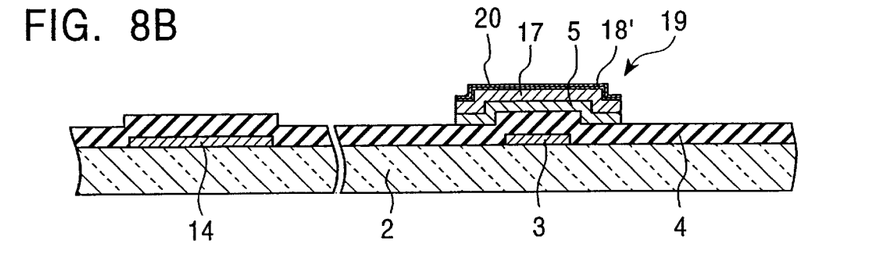

As shown in FIG. 8B, five layers, i.e., a $SiO_x$ or a $SiN_x$ film (gate insulation film 4), an a-Si film (to later become semiconductor active layer 5), an a-Si:n+ film 17 (doped semiconductor film), a barrier metal film 18' composed of titanium, and a titanium oxide layer 20, are formed over the entire surface of the substrate. Methods for forming films may be equivalent to those in the first embodiment. In this connection, the titanium oxide layer 20 is formed by exposing the surface of the titanium film to ultraviolet light at approximately 200 W/cm² in the air for 1 minute to several minutes.

After forming the five layers, a resist pattern is formed on the titanium oxide layer 20, and four layers among the five layers, i.e., the titanium oxide layer 20, the barrier metal film 18', the a-Si:n⁺ film 17, and the a-Si film, are etched by using the resist pattern mentioned above. As a result, a laminated island 19 is formed, which is composed of 4 layers, i.e., the semiconductor active layer 5, the a-Si:n⁺ 17, the barrier metal film 18', and the titanium oxide layer 20.

In order to etch the individual films described above, wet etching and dry etching can be used similar to those in the first embodiment. The titanium oxide layer 20 that is not used in the first embodiment can be processed by an etching method similar to that used for the titanium film.

Figure 8C:
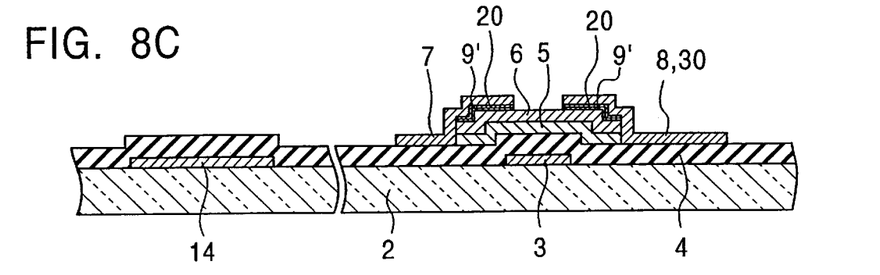

Next, as shown in FIG. 8C, a copper film 30 is formed on the entire surface of the substrate, and is wet-etched by using a resist pattern as a mask formed on the copper film 30, whereby a source wiring, the source electrode 7, and the drain electrode 8 are formed. As an etchant used in this step, one of the following aqueous solutions is used: an aqueous solution containing monohydrogen potassium peroxomonosulfate and hydrogen fluoride, an aqueous solution containing a peroxosulfate salt, hydrogen fluoride, and hydrogen chloride or a chloride compound, and an aqueous solution containing a peroxosulfate salt and a fluoride. By using these etchants described above, the three layers, i.e., the copper film 30, the titanium oxide layer 20, and the barrier metal film 18' composed of titanium, can be simultaneously etched. Accordingly, patterning of the source electrode 7 and the drain electrode 8 and removing of the titanium oxide layer 20 and the barrier metal film 18', which are positioned above a channel region between the source electrode 7 and the drain electrode 8, can be simultaneously performed.

Figure 8D:
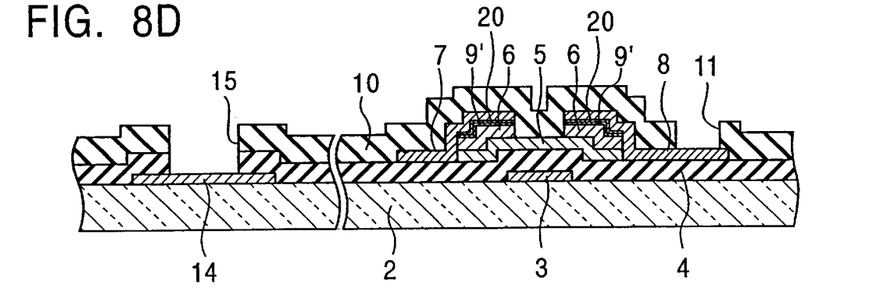

Next, as shown in FIG. 8D, the a-Si:n$^+$ film 17 located above the channel region between the source electrode 7 and the drain electrode 8 is removed by etching so as to form the ohmic contact layers 6. Subsequently, similar to those in the first embodiment, formation of passivation film 10 followed by formation of contact holes 11 and 15 is performed.

Figure 8E:
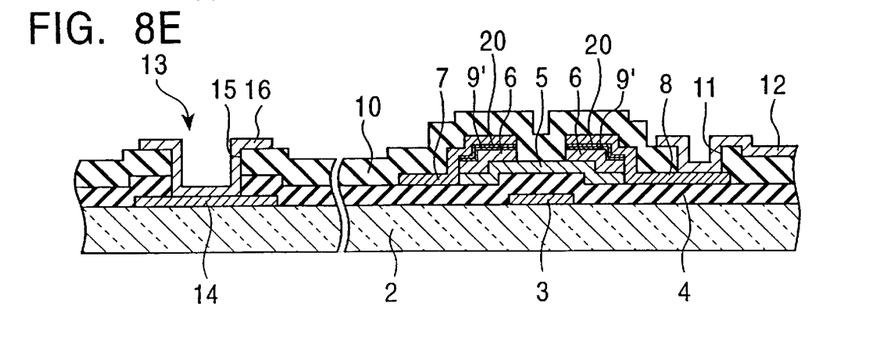

Finally, as shown in FIG. 8E, an ITO film is formed and is then patterned so as to form a pixel electrode 12, an upper pad layer 16, and the like, whereby the TFT array substrate is completed.

In the second embodiment, the patterning of the barrier metal film and the patterning of the source electrode and the drain electrode can be simultaneously performed by using the etchant capable of simultaneously etching a laminate composed of titanium and copper. The etchants are the aqueous solution containing monohydrogen potassium peroxomonosulfate and hydrogen fluoride, the aqueous solution containing a peroxosulfate salt, hydrogen fluoride, and hydrogen chloride or a chloride compound, and the aqueous solution containing a peroxosulfate salt and a fluoride. In this step, since the structure has the titanium oxide layer 20 disposed between the copper film 30 and the barrier metal film 18', uniformity obtained in the simultaneous etching is improved. Hence, the problems can be prevented, which are variations in TFT characteristics, degradation of reliability, and the like caused by etching residue of the barrier metal film 18' composed of titanium.

The technical aspect of the present invention is not limited to the embodiments described above. It is to be understood that changes and variations may be made without departing from the sprit or the scope of the present invention. For example, concerning materials for individual films composing the TFT, materials other than those described above may be optionally selected. For example, polycrystalline silicon formed by laser annealing amorphous silicon formed beforehand may be used for the semiconductor active layer. Metals other than aluminum (Al) may be used as a material for the gate electrode. In addition, process conditions and the like in various steps of a manufacturing process may be optionally selected.

As has thus been described, according to the present invention, the undercuts in the barrier metal layer formed during formation of the source and the drain electrodes are not formed. As a result, the characteristic defect of the TFT caused by the undercuts in the barrier metal layer can be prevented. In addition, the barrier metal layers are only present above the areas at which the ohmic contact layers are formed. The source wiring is only composed of copper, whereby the source wiring having a resistance lower than that of the conventional wiring can be obtained. In particular, when titanium is used for the barrier metal layer, and titanium oxide layer is disposed between the copper film and the titanium film, uniformity obtained in the simultaneous etching is improved. The problems can be prevented, which are variations in TFT characteristics, degradation of reliability, and the like caused by etching residue of the barrier metal film 18' composed of titanium. In addition, when the contacting points between the semiconductor active layer and the source electrode and between the semiconductor active layer and the drain electrode are disposed distant from the gate electrode, the problem with regard to an increase in off-current can be avoided.

What is claimed is:

1. A method for manufacturing a thin film transistor comprising the steps of:

forming an electrically conductive film on a substrate;

patterning the electrically conductive film so as to form a gate electrode;

forming a gate insulation film so as to cover the gate electrode, a semiconductor film, a doped semiconductor film doped with an impurity, and a barrier metal film in that order;

patterning the barrier metal film, the doped semiconductor film, and the semiconductor film so as to form a laminated island having a semiconductor active layer formed of the semiconductor film, the doped semiconductor film, and the barrier metal film;

forming a copper film so as to cover the laminated island and the gate insulation film;

patterning the copper film so as to form a source electrode and a drain electrode extending from the laminated island onto the gate insulation film; and removing the barrier metal film and the doped semiconductor film by etching using the source electrode and the drain electrode as a mask so that ohmic contact layers formed of the doped semiconductor film and patterned layers formed of the barrier metal film are present above two edge portions of the semiconductor active layer.

2. A method for manufacturing a thin film transistor according to claim 1, wherein the gate insulation film, the semiconductor film, the doped semiconductor film, and the barrier metal film are sequentially formed without being exposed in the air.

3. A method for manufacturing a thin film transistor comprising the steps of:

forming an electrically conductive film on a substrate;

patterning the electrically conductive film so as to form a gate electrode;

forming a gate insulation film so as to cover the gate electrode, a semiconductor film, a doped semiconductor film doped with an impurity, and a barrier metal film comprising titanium in that order;

patterning the barrier metal film, the doped semiconductor film, and the semiconductor film so as to form a laminated island having a semiconductor active layer formed of the semiconductor film, the doped semiconductor film, and the barrier metal film;

forming a copper film so as to cover the laminated island and the gate insulation film;

patterning the copper film and the barrier metal film by using the same etchant so as to form a source electrode and a drain electrode extending from the laminated island onto the gate insulation film; and removing the doped semiconductor film by etching using the source electrode and the drain electrode as a mask so that ohmic contact layers formed of the doped semiconductor film and patterned layers formed of the barrier metal film are present above two edge portions of the semiconductor active layer.

* * * * *

UNITED STATES PATENT AND TRADEMARK OFFICE
CERTIFICATE OF CORRECTION

PATENT NO. : 6,432,755 B2
DATED : August 13, 2002
INVENTOR(S) : Chae Gee Sung et al.

It is certified that error appears in the above-identified patent and that said Letters Patent is hereby corrected as shown below:

<u>Title page,</u>
Item [30], Foreign Application Priority Data, delete "Jan. 5, 2000" and substitute -- Jan. 5, 1999 -- in its place.

Signed and Sealed this

First Day of April, 2003

JAMES E. ROGAN
*Director of the United States Patent and Trademark Office*